US008175285B2

(12) United States Patent
Suzuki

(10) Patent No.: US 8,175,285 B2
(45) Date of Patent: May 8, 2012

(54) AUDIO PLAYER APPARATUS HAVING SOUND ANALYZER AND ITS CONTROL METHOD

(75) Inventor: Noriaki Suzuki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 712 days.

(21) Appl. No.: 12/365,453

(22) Filed: Feb. 4, 2009

(65) Prior Publication Data

US 2009/0196440 A1 Aug. 6, 2009

(30) Foreign Application Priority Data

Feb. 4, 2008 (JP) ................................ 2008-023471

(51) Int. Cl.
*H03G 3/00* (2006.01)

(52) U.S. Cl. .......................... 381/61; 381/119; 381/307

(58) Field of Classification Search .................... 381/61, 381/119, 307

See application file for complete search history.

(56) References Cited

U.S. PATENT DOCUMENTS 3,581,012 A * 5/1971 Kishi et al. ...................... 381/91
5,448,647 A 9/1995 Koizumi
6,918,461 B2 * 7/2005 Christie ........................ 181/148
2005/0147257 A1 * 7/2005 Melchior et al. ................ 381/61
2007/0036366 A1 2/2007 Konagai

FOREIGN PATENT DOCUMENTS

JP 06-105257 4/1994
JP 2007-225482 9/2007

* cited by examiner

*Primary Examiner* — Thanh V Pham

(74) *Attorney, Agent, or Firm* — Canon USA Inc IP Division

(57) ABSTRACT

An audio player apparatus includes a first speaker disposed to output a sound from a front face of a flat panel television apparatus to the outside, a second speaker disposed to output a sound from a backside of the flat panel television apparatus to the outside, a microphone disposed on the backside of the flat panel television apparatus to receive the sound output from the second speaker and to convert the received sound into an electric signal, an analysis unit configured to detect a reflected sound and reflection time of the sound output from the second speaker based on a second audio signal supplied to the second speaker and the electric signal output from the microphone, and a phase correction unit configured to correct a phase of at least one of a first audio signal supplied to the first speaker and the second audio signal based on the reflection time.

9 Claims, 13 Drawing Sheets

AUDIO PLAYER APPARATUS HAVING SOUND ANALYZER AND ITS CONTROL METHOD

BACKGROUND OF THE INVENTION

1. Field of the Invention

The present invention relates to an audio player apparatus for controlling output characteristics of a plurality of speakers by analyzing acoustic characteristics of a reflected sound, and its control method.

2. Description of the Related Art

Conventionally, in a speaker apparatus, a woofer is disposed on sides and a tweeter is disposed at the front utilizing relative lack of directivity of a sound output from the bass-sound reproduction speaker. This arrangement can realize a speaker for a television apparatus, which can reproduce good bass sound and reduce a width of the apparatus (refer to Japanese Patent Application Laid-Open No. 06-105257).

Further, a conventional sound field measuring device picks up a signal to be measured that is reproduced in a measuring sound field, by a directional microphone having a plurality of directional axes, and analyzes the measured signal for each direction. This device enables evaluation of spread feelings or reverberation feelings regarding spatiality of the sound field, or location feelings of a sound image by analyzing reflected sound components in a room (refer to Japanese Patent Application Laid-Open No. 2007-225482).

However, in the case of the speaker apparatus of the television apparatus discussed in Japanese Patent Application Laid-Open No. 06-105257, a speaker unit is not disposed in a backside of the television apparatus. Therefore, the speaker apparatus cannot be an audio system which uses a reflected sound from a wall.

In the case of the sound field measuring device discussed in Japanese Patent Application Laid-Open No. 2007-225482, the inclusion of the plurality of directional axes in the microphone results in a complex configuration of the microphone. The microphone has to be disposed in a listening position to measure a sound field. A wiring line becomes accordingly longer, and a size of the entire device increases, creating a problem of complex handling. The microphone can be mounted on a device such as a remote controller set in a listening position. In this case, however, a microphone amplifier or an AD converter has to be disposed in the microphone, and a large amount of measured data has to be transmitted, causing a great increase in a circuit size of the remote controller. Furthermore, if the remote controller is set on a plane of a table, characteristics of the microphone are affected, so that it becomes difficult to accurately perform measurement.

SUMMARY OF THE INVENTION

The present invention is directed to an audio system which includes a speaker disposed in a backside and uses a reflected sound from a wall, and more particularly to an audio player apparatus which can analyze acoustic characteristics of a reflected sound with a compact configuration.

According to an aspect of the present invention, an audio player apparatus includes a first speaker disposed to output a sound from a front face of a flat panel television apparatus to the outside, a second speaker disposed to output a sound from a backside of the flat panel television apparatus to the outside, a microphone disposed to receive the sound output from the second speaker on the backside of the flat panel television apparatus and to convert the received sound into an electric signal, an analysis unit configured to detect a reflected sound and reflection time of the sound output from the second speaker based on a second audio signal supplied to the second speaker and the electric signal output from the microphone, and a phase correction unit configured to correct a phase of at least one of a first audio signal supplied to the first speaker and the second audio signal based on the reflection time.

When the flat television apparatus including the audio player apparatus of an exemplary embodiment of the present invention is installed before a wall, even if a distance from a wall surface or acoustic reflection characteristics of the wall surface change, good sound reproduction is performed with little interferences or characteristic fluctuations caused by an influence of a reflected sound.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

Figure 1:
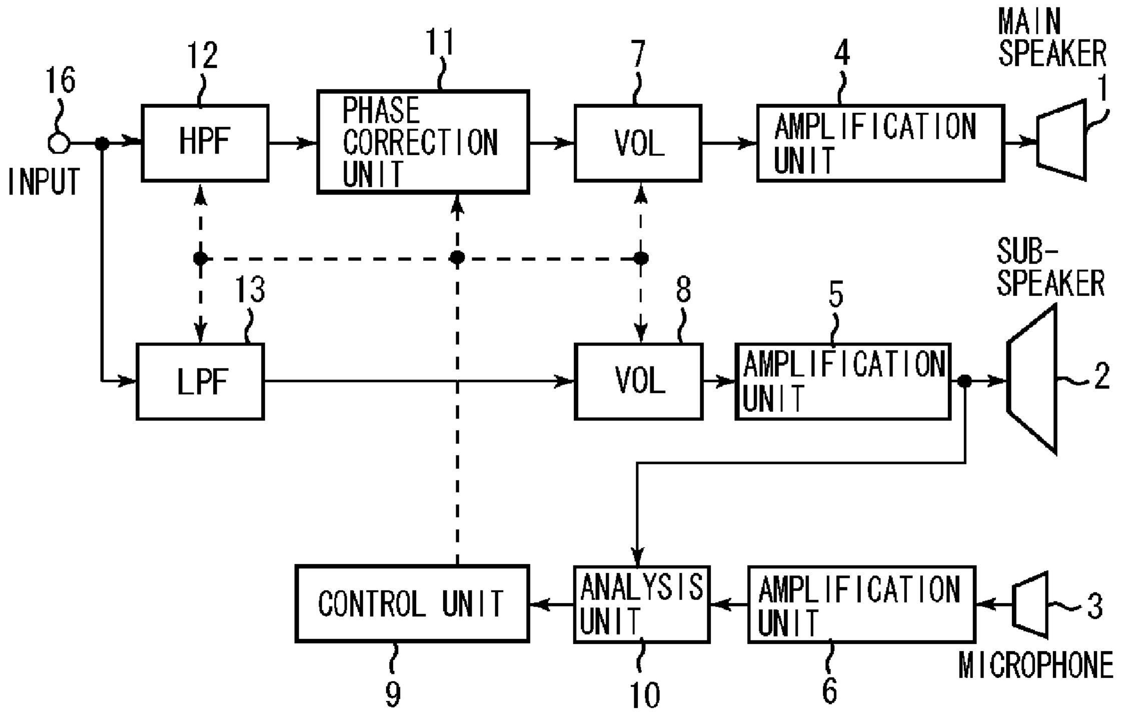
FIG. 1 is a block diagram of an audio player apparatus according to a first exemplary embodiment of the present invention.

FIG. 1 is a block diagram of an audio player apparatus according to a first exemplary embodiment of the present invention.

An input audio signal that has entered an input unit 16 is input to high-pass and low-pass filters 12 and 13.

Under control of a control unit 9, the high-pass and low-pass filters 12 and 13 respectively pass high-frequency and low-frequency components of the input audio signal to output them.

A phase correction unit 11 corrects a phase of an output of the high-pass filter 12 under control of the control unit 9. The phase correction unit 11 may be configured to correct a phase of an output of the low-pass filer 13, or correct phases of outputs of both filters.

A first volume adjustment unit 7 adjusts output amplitude of the phase correction unit 11 under control of the control unit 9.

A second volume adjustment unit 8 adjusts output amplitude of the low-pass filter 13 under control of the control unit 9.

A first amplification unit 4 amplifies an output of the first volume adjustment unit 7 to an output level that can drive a main speaker 1 (equivalent to first speaker).

A second amplification unit 5 amplifies an output of the second volume adjustment unit 8 to an output level that can drive a sub-speaker 2 (equivalent to second speaker).

A third amplification unit 6 amplifies an output of a microphone 3 to an output level that can be analyzed by an analysis unit 10.

The main speaker 1 converts a high-frequency audio signal (equivalent to first audio signal), which is an output of the first amplification unit 4, into an audible sound.

The sub-speaker 2 converts a low-frequency audio signal (equivalent to second audio signal), which is an output of the second amplification unit 5, into an audible sound.

The microphone 3 receives a sound output from the sub-speaker 2 and its reflected sound into an electric signal.

The analysis unit 10 compares an output of the third amplification unit 6 with the output of the second amplification unit 5 to analyze a distance from a position of the sub-speaker 2 to an object which reflects the output sound of the sub-speaker 2, and acoustic reflection characteristics.

The control unit 9 adjusts frequency characteristics, phase characteristics, and amplitude characteristics of the sounds output from the main speaker 1 and the sub-speaker 2 according to an analyzing result of the analysis unit 10.

Referring to a flowchart of FIG. 2, an operation of the audio player apparatus of the exemplary embodiment will be described below.

When the audio player apparatus is turned on to start processing, in step S1, the control unit 9 sets an output adjustment value of the second volume adjustment unit 8 to a specific value. As a result, the second amplification unit 5 amplifies a low-pass filtered signal among entered audio signals to input the amplified signal to the sub-speaker 2. In response to the entered audio signal, the sub-speaker 2 outputs a low tone sound/signal.

The low tone sound output from the sub-speaker 2 is reflected around the speaker to become a reflected sound. In step S2, the analysis unit 10 compares a reflected sound converted into an electric signal by the microphone 3, with a low-pass filtered signal output from the second amplification unit 5 to calculate/analyze reflection time.

In step S3, the control unit 9 sets/controls, based on the reflection time, characteristics of the phase correction unit 11 so as to prevent interferences caused by a phase difference between the output sound of the main speaker 1 directly reaching a listener and the output sound of the sub-speaker 2 reaching the listener as a reflected sound.

In step S4, the analysis unit 10 compares the output signal of the microphone 3 with the low-pass filtered signal output from the second amplification unit 5 to analyze a sound pressure level of the reflected sound and amplitude frequency characteristics.

In step S5, according to the sound pressure level and the amplitude frequency characteristics, the control unit 9 reduces a set volume of the second volume adjustment unit 8 to prevent generation of an excessive amount of bass sound if the sound pressure level of the reflected sound is high or there are much low-frequency components. In step S6, if the reflected sound contains much specific frequency components, the control unit 9 adjusts cutoff frequencies of the high-pass and low-pass filers 12 and 13 to prevent the frequency components from becoming excessive. This processing enables appropriate adjustment of output characteristics of the main speaker 1 and the sub-speaker 2.

Figure 3:
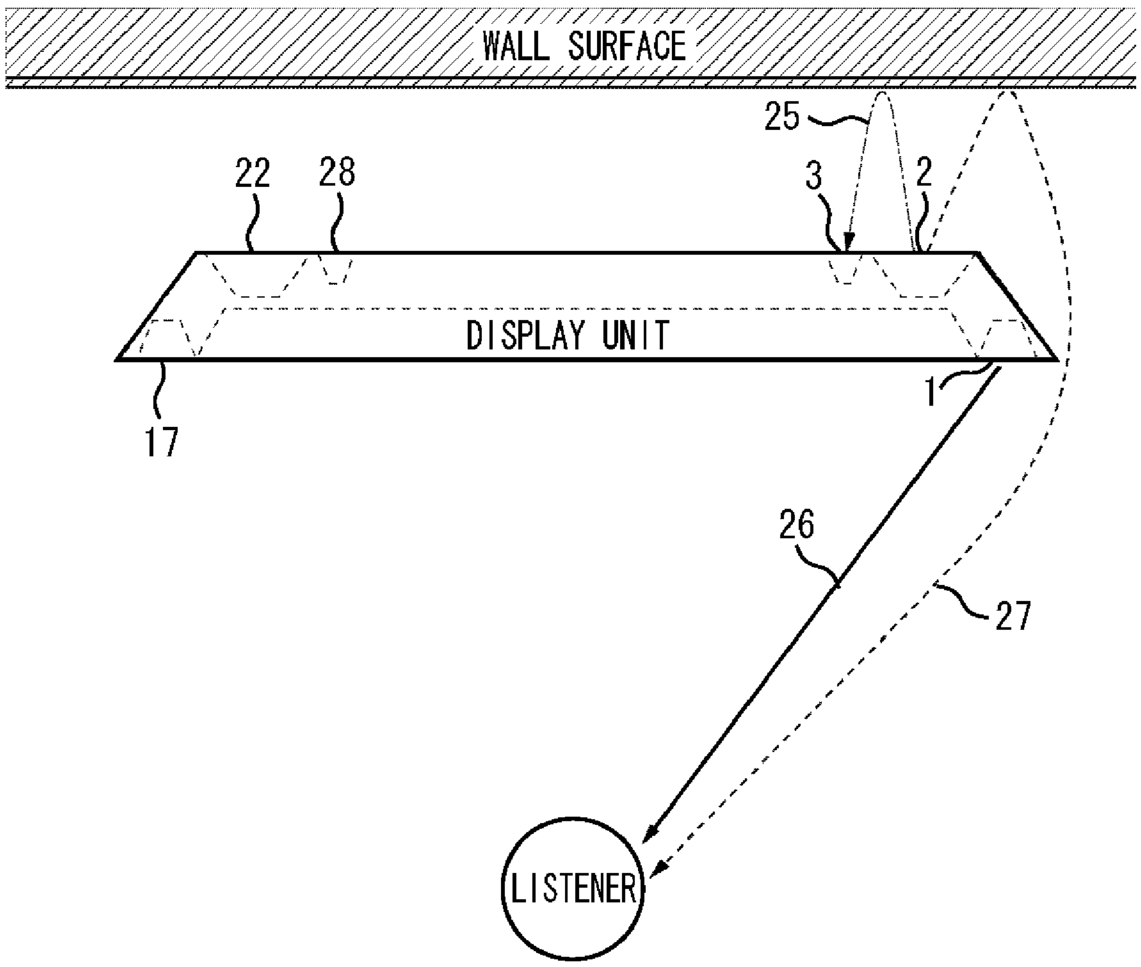
FIG. 3 is a schematic diagram of a television apparatus which includes the audio player apparatus according to the first exemplary embodiment of the present invention.

FIG. 3 illustrates a configuration when the audio player apparatus of the exemplary embodiment is applied to a television apparatus. To efficiently convert the reflection of the sound output from the sub-speaker 2 into an electric signal, the microphone 3 is disposed near the sub-speaker 2.

Referring to the flowchart of FIG. 2 again, an operation of the television apparatus will be described below. A flat panel television apparatus is installed with a wall on its backside. The main speaker 1 is disposed on a front side of the flat panel television apparatus, and the sub-speaker 2 is disposed on a backside.

In the signal output processing (step S1), the sound output from the sub-speaker 2 is reflected on the wall surface located on the backside of the television apparatus rear part and a reflected sound enters the microphone 3. By using the reflected sound, in the reflection time analysis processing (step S2), a length of a path 25 that the reflected sound travels to reach a listener is calculated. The length of a path 25 varies according to a distance from the wall surface. The control unit 9 stores a path length difference table for calculating a difference in path length between a direct reaching path 26 and a reflection reaching path 27 based on the length of the path 25 that the reflected sound travels.

The control unit 9 adjusts, by using the path length table, phases of output sounds so as to prevent interferences between the output sound of the main speaker 1 which directly reaches the listener and the output sound of the sub-speaker 2 which is reflected on the wall to reach the listener. The interferences are caused by a phase difference that is generated by a path length difference (step S3).

Figure 4A:
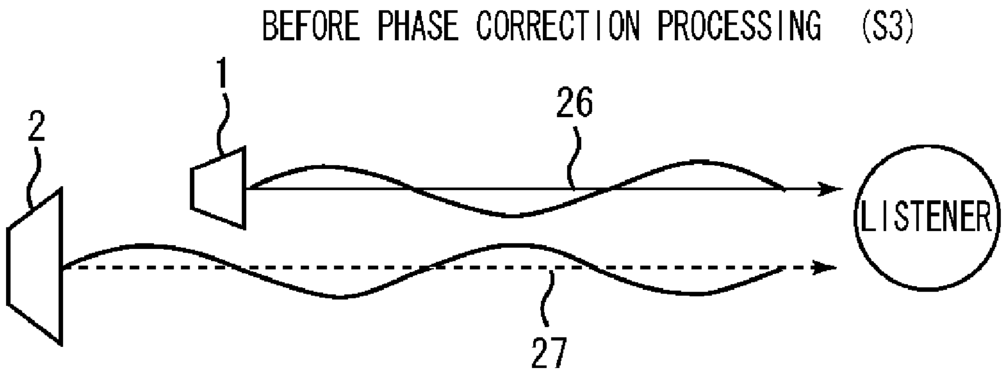
FIGS. 4A and 4B are diagrams each illustrating a phase of an output sound of the present invention.
Figure 4B:
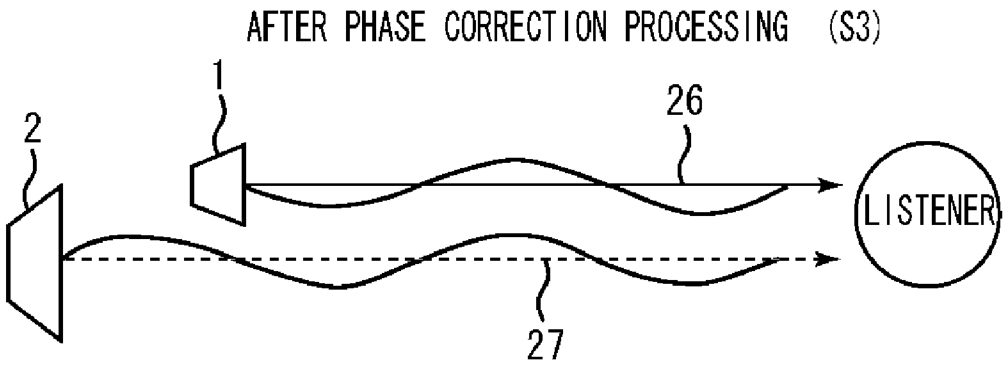

More specifically, when sounds interfere with each other to cancel each other between the direct reaching path 26 and the reflection reaching path 27 as illustrated in FIG. 4A, the control unit 9 corrects a phase of the output sound of the first speaker 1 so as to set the phases to be equal to each other as illustrated in FIG. 4B.

Then, in reflection frequency characteristic analysis processing (step S4), the analysis unit 10 analyzes an acoustic reflectance ratio of the wall surface, reflection frequency characteristics, and a sound pressure level and frequency characteristics of a reflected sound. The sound pressure level and frequency characteristics change depending on a relationship between a distance from the sub-speaker 2 to the wall surface, and a spatial wavelength.

Figure 5A:
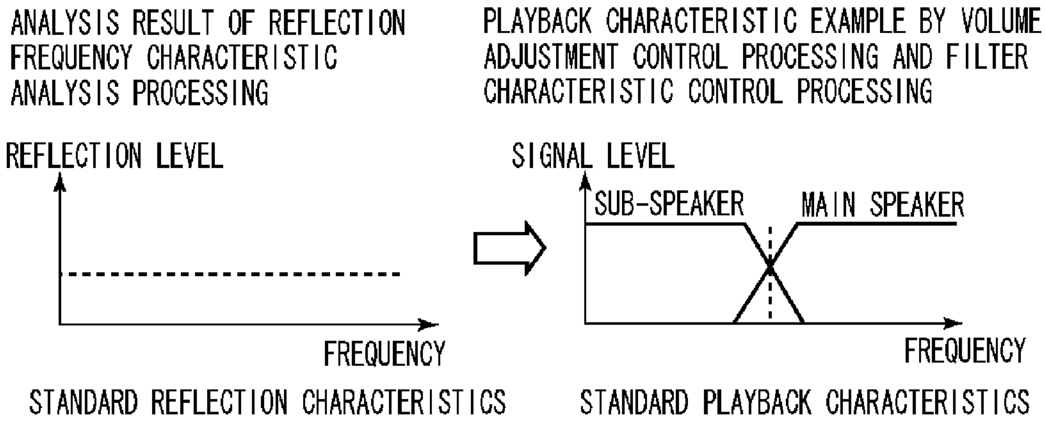
FIGS. 5A to 5C are diagrams each illustrating an example of playback characteristics of the audio player apparatus according to the first exemplary embodiment of the present invention.
Figure 5B:
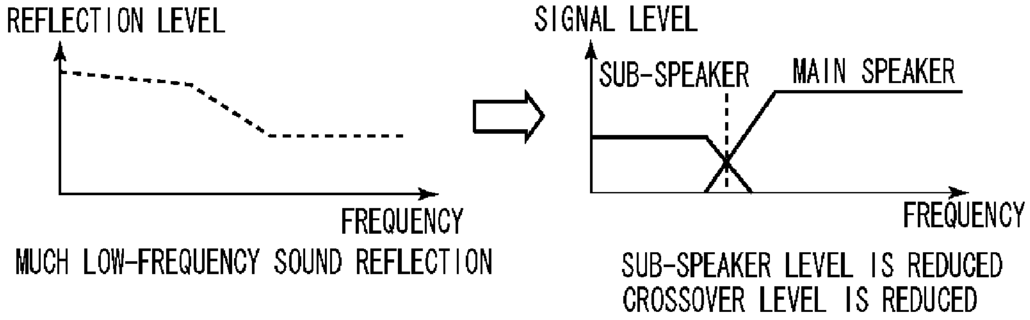
Figure 5C:
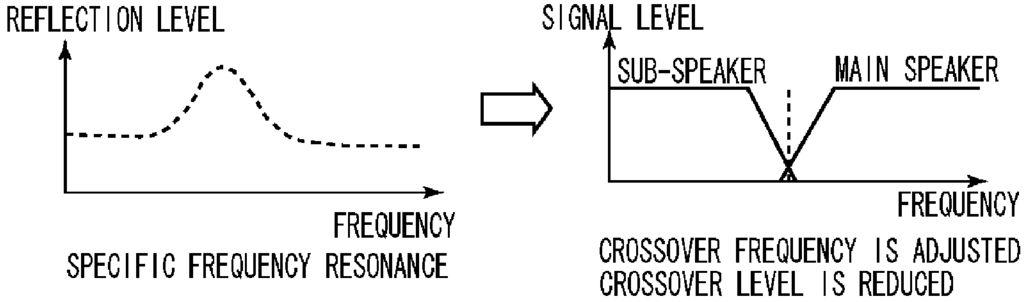
Figure 6:
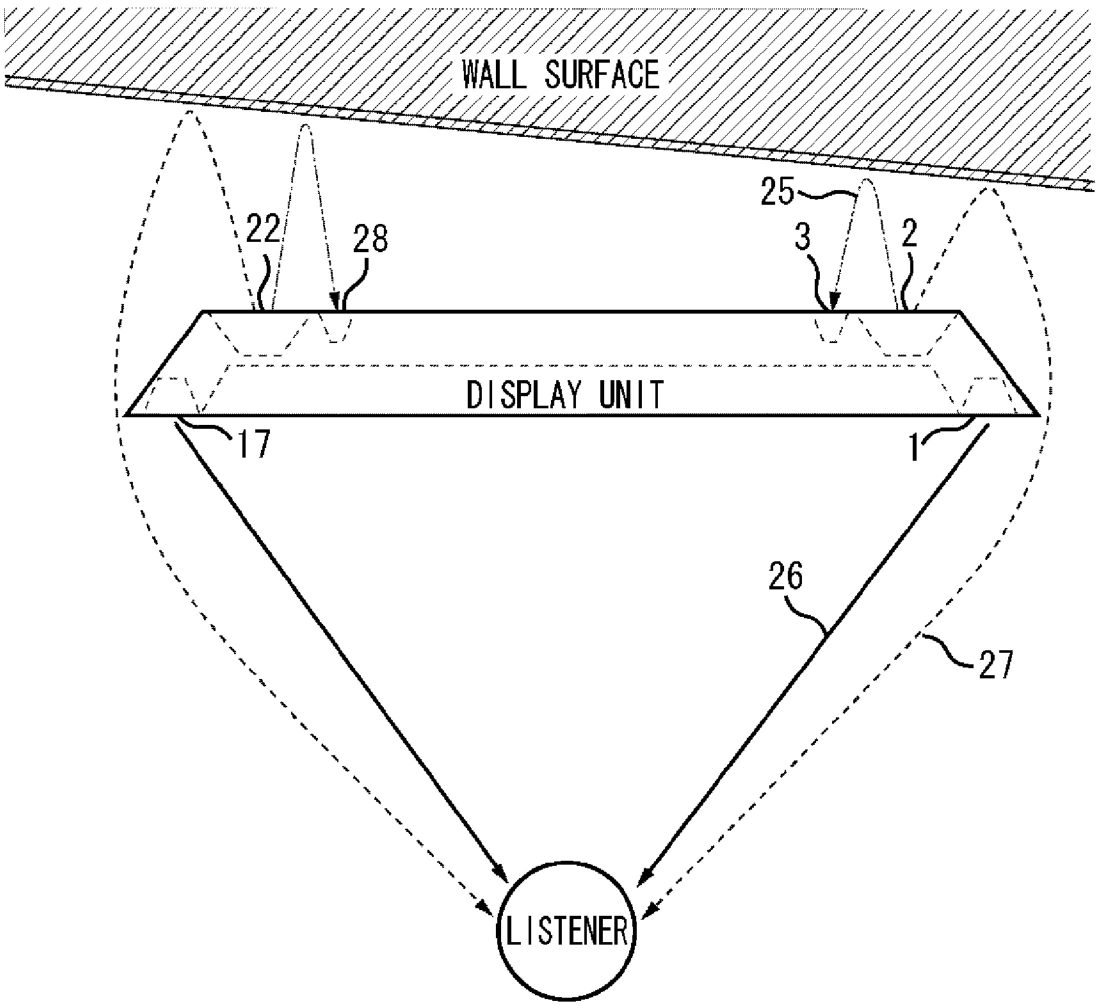
FIG. 6 is a schematic diagram when the television apparatus including the audio player apparatus according to the first exemplary embodiment of the present invention is disposed nonparallel with a wall surface.

FIGS. 5A to 5C illustrate examples of sound reproduction characteristics set by volume adjustment control processing (step S5) and filtering characteristic control processing (step S6) according to an analyzing result of the reflection frequency characteristic analysis processing (step S4).

As illustrated in FIG. 5A, when reflection level of a sound is virtually not dependent on a frequency, signal levels of the sub-speaker 2 and the main speaker 1 are set equal to each other, and a crossover level is set at an intermediate level.

As illustrated in FIG. 5B, when a reflected sound contains much low-frequency components, or when a sound pressure level is high, to prevent generation of an excessive amount of bass sound, the second volume adjustment unit 8 modulates an input signal by lowering a signal level of a low-frequency audio signal. As illustrated in FIG. 5C, when a reflected sound contains much specific frequency components, to prevent generation of an excessive amount of the specific frequency, the control unit 9 adjusts cutoff frequencies of the high-pass and low-pass filters 12 and 13. As a result, a crossover level of frequency characteristics of high-frequency and low-frequency audio signals is modulated to a low level side.

The processing that has been described is concerned with only a right channel in a stereo configuration. For a left channel, similar processing is carried out by a second main speaker 17, a second sub-speaker 22, and a second microphone 28 independently of the right channel. Since the processing of the left and right channels is independently performed, the present invention can be easily applied even when the television apparatus is arranged nonparallel with the wall surface.

An angle with the wall surface is calculated based on a difference in length of microphone reaching paths 25 of the reflected sound, between the left and right channel, so that more accurate correction can be performed.

Figure 7:
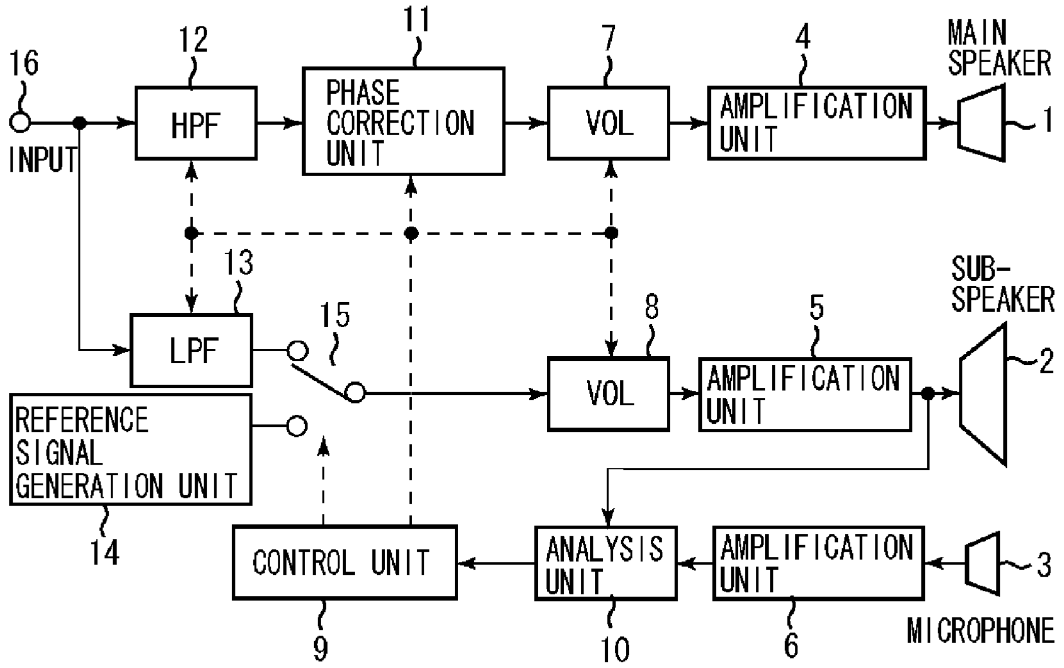
FIG. 7 is a block diagram of an audio player apparatus according to a second exemplary embodiment of the present invention.

FIG. 7 is a block diagram of an audio player apparatus according to a second exemplary embodiment of the present invention.

The audio player apparatus of the present exemplary embodiment includes a reference signal generation unit 14 configured to output a reference signal used for measurement, and a selection unit 15. The selection unit 15 is configured to select, under control of a control unit 9, one of outputs of a low-pass filter 13 and the reference signal generation unit 14, and to output a low-frequency audio signal. Except for an operation relating to the selection unit 15, operations according to the present exemplary embodiment are similar to the first exemplary embodiment.

When the apparatus is turned ON, the control unit 9 controls the selection unit 15 to select the output of the reference signal generation unit 14. Then, by using a reference signal, correction processing of the flowchart of FIG. 2 is carried out as in the case of the first exemplary embodiment. After completion of the correction processing, the control unit 9 controls the selection unit 15 to switch to the output signal of the low-pass filter 13 based on the reference signal.

For the reference signal, a signal in which a signal level has fixed amplitude timewise and does not depend on frequency, or a signal having a signal level proportional to a frequency, can be used.

According to the exemplary embodiment, since the correction processing is carried out by using the reference signal that has the stable signal level, more accurate correction can be performed.

Figure 8:
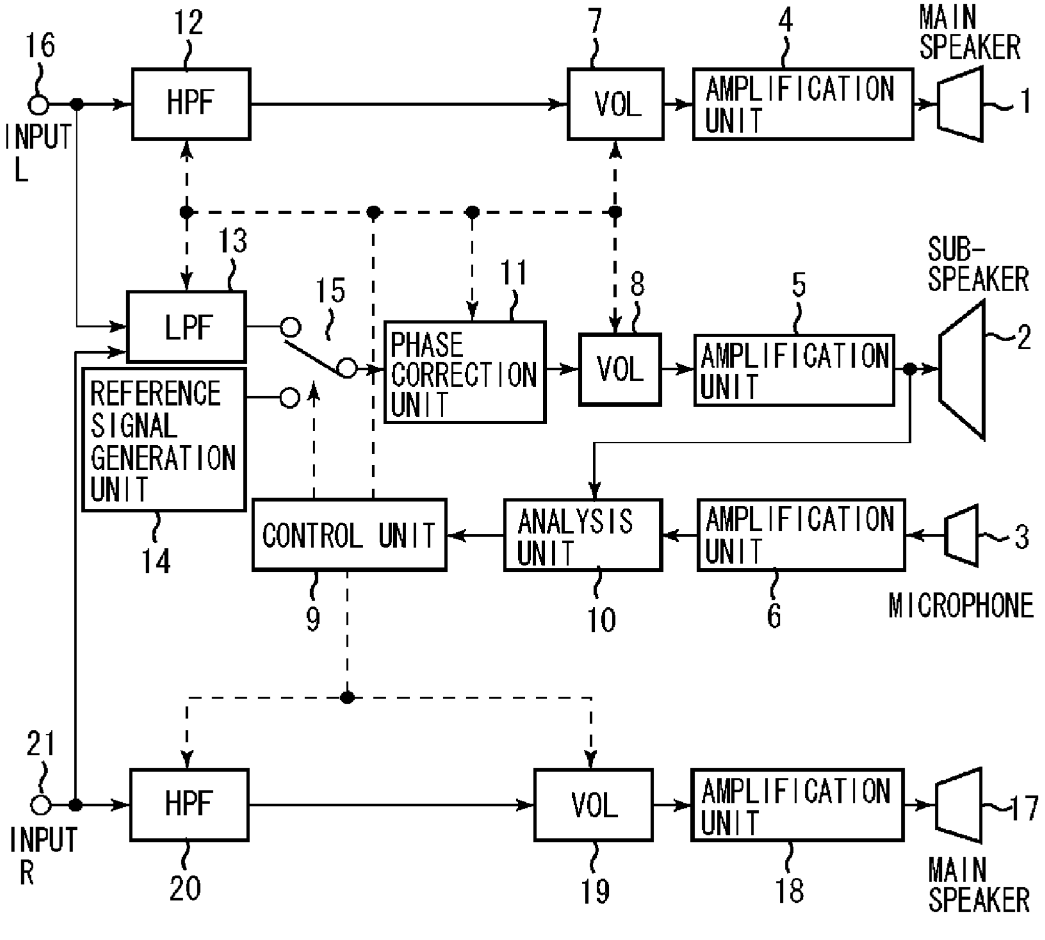
FIG. 8 is a block diagram of an audio player apparatus according to a third exemplary embodiment of the present invention.

FIG. 8 is a block diagram of an audio player apparatus according to a third exemplary embodiment of the present invention.

Figure 9:
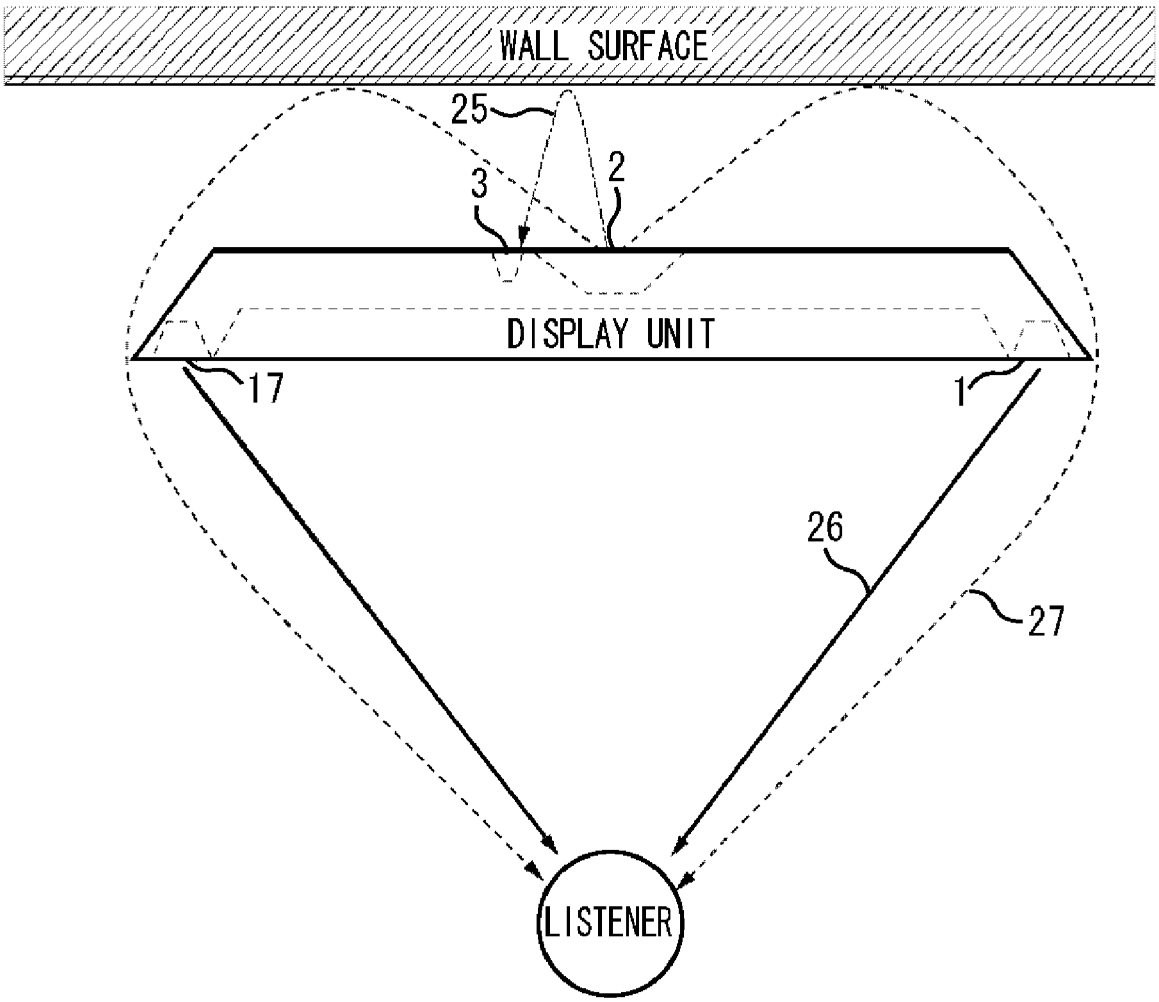
FIG. 9 is a schematic diagram of a television apparatus which includes the audio player apparatus according to the third exemplary embodiment of the present invention.

FIG. 9 is a configuration diagram when the audio player apparatus of the third exemplary embodiment is applied to a television apparatus.

The audio player apparatus of the present exemplary embodiment has a 2.1 channel configuration in which a first input unit 16 and a second input unit 21 correspond to left and right channels of a stereo signal respectively. A sub-speaker 2 is a sub-woofer for reproducing low tone sounds of both channel inputs. A first main speaker 1 reproduces a high tone sound of a left channel input, and a second main speaker 17 reproduces a high tone sound of a right channel input. Audio signal through a high-pass filter 20 is adjusted in volume by a volume adjustment unit 19, amplified by an amplification unit 18 and entered to the second main speaker 17.

When a selection unit 15 selects a reference signal, as in the case of the second exemplary embodiment, signal output processing (step S1) and reflection time analysis processing (step S2) are carried out to recognize a length of a reflected sound microphone reaching path 25. Then, a control unit 9 calculates a direct reaching path 26 and a reflection reaching path 27. According to a result of this calculation, the control unit 9 performs phase control processing (step S3). Then, reflection frequency characteristic analysis processing (step S4), volume adjustment control processing (step S5), and filtering characteristics control processing (step S6) are carried out.

Audio signals received from the first and second input units 16 and 21 are converted into a monaural low-frequency signal by a low-pass filter 13. In low-frequency signal output processing (step S7), left and right low tone sounds are output from the sub-speaker 2. A sense of sound direction becomes duller as a frequency becomes lower. Thus, even in monaural reproduction, a sound can be reproduced with little influence on stereo separation in listening.

The sub-speaker 2 and the microphone 3 can be respectively configured only by one device, and by executing a series of the operations, stereo audio reproduction can be realized with few interferences or characteristic fluctuations caused by the influence of the reflected sound.

Figure 10:
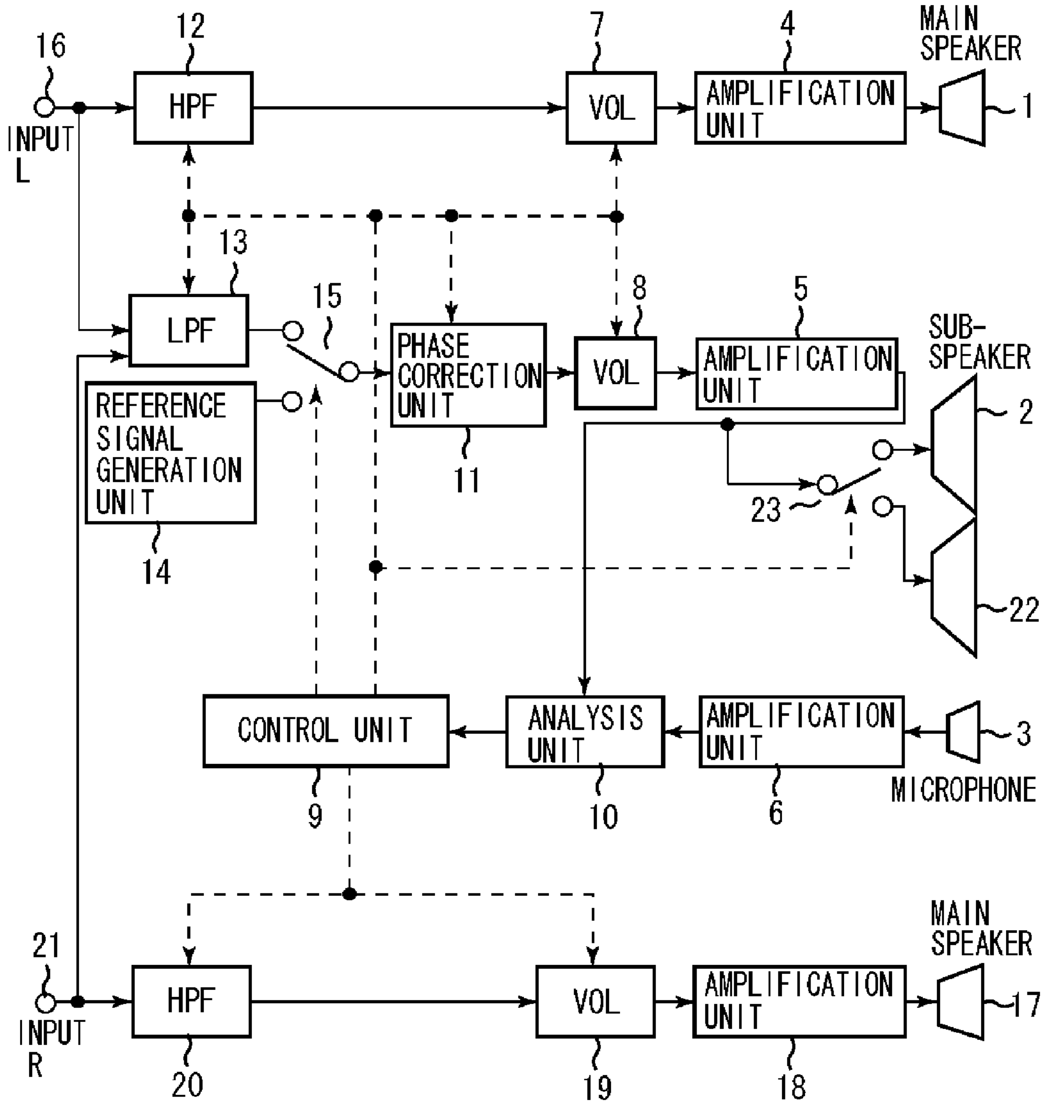
FIG. 10 is a block diagram of an audio player apparatus according to a fourth exemplary embodiment of the present invention.

FIG. 10 is a block diagram of an audio player apparatus according to a fourth embodiment of the present invention.

Figure 11A:
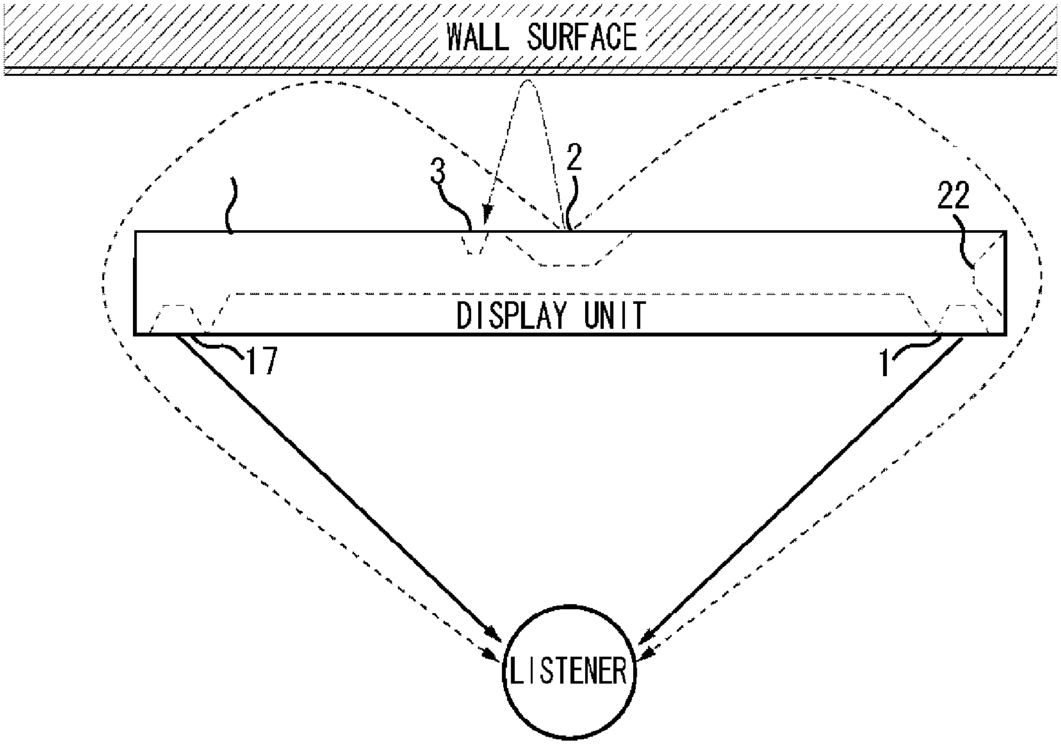
FIGS. 11A and 11B are schematic diagrams each illustrating a television apparatus which includes the audio player apparatus according to the fourth exemplary embodiment of the present invention.
Figure 11B:
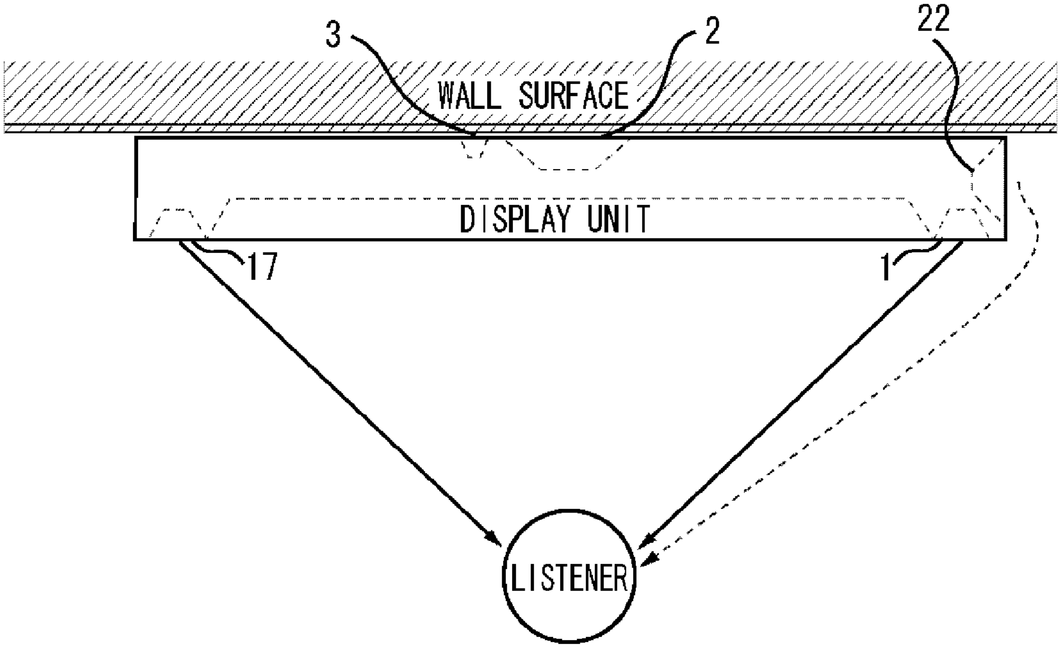

FIGS. 11A and 11B are configuration diagrams when the audio player apparatus of the fourth embodiment is applied to a television apparatus.

The audio player apparatus of the present exemplary embodiment includes a second sub-speaker 22 disposed in a position different from that of a first sub-speaker 2, and a second selection unit 23 configured to select one of the first and second sub-speakers 2 and 22 to supply an output of a second amplification unit 5 under control of a control unit 9.

Figure 2:
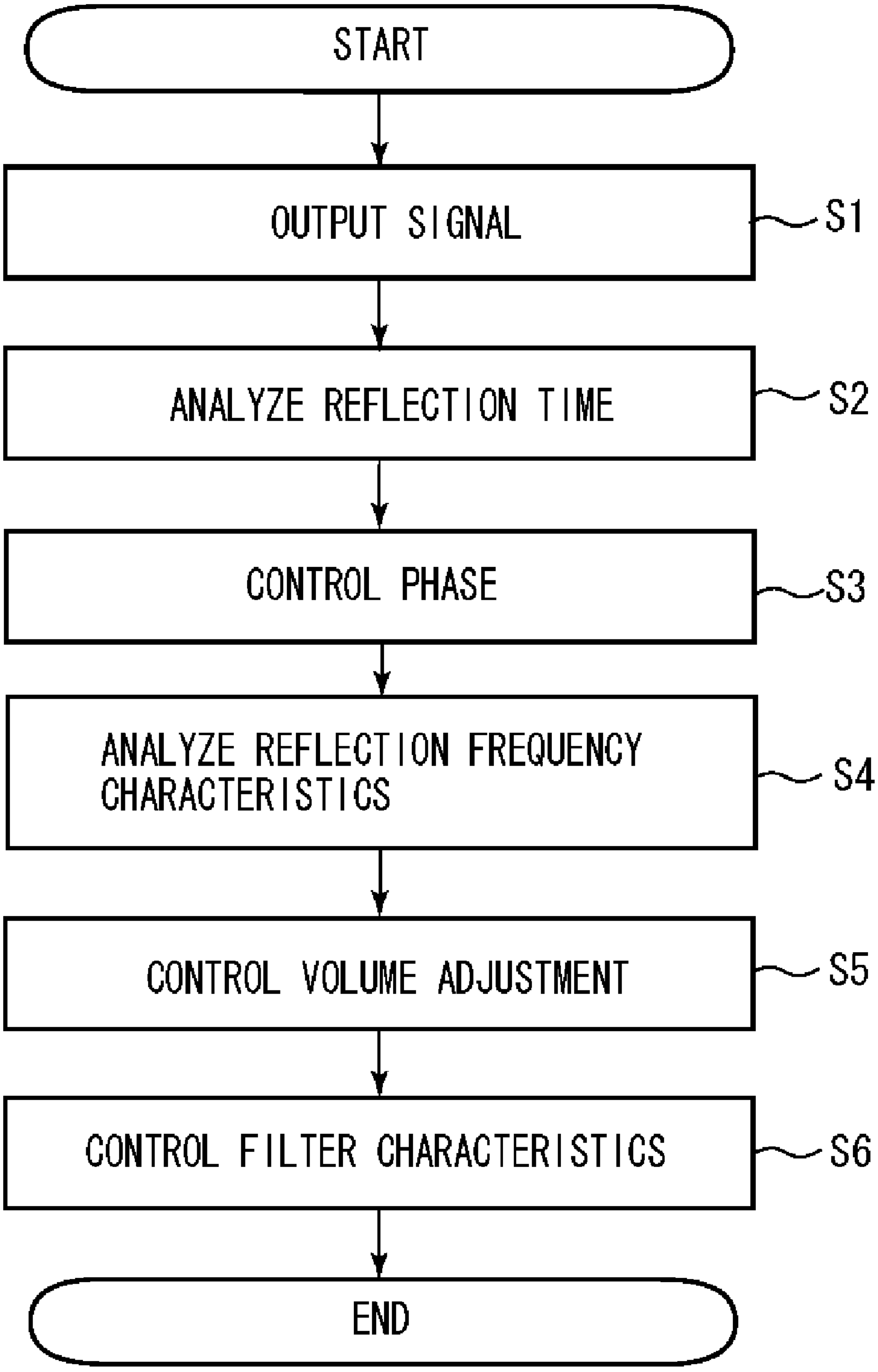
FIG. 2 is a flowchart illustrating processing in the audio player apparatus according to the first exemplary embodiment of the present invention.

When a first selection unit 15 selects an output of a reference signal, as in the case of the second exemplary embodiment, the audio player apparatus is operated according to the flowchart of FIG. 2. When it is detected that reflection time is within fixed time as a result of reflection time analysis processing (step S2), or that a reflection level is outside a fixed range as a result of reflection frequency characteristic analysis processing (step S4), the control unit 9 determines that the television apparatus is used in a wall-mounted state. Then, the second selection unit 23 selects the second sub-speaker 22. Characteristics of a phase correction unit 11, a sound volume of a second volume adjustment unit 8, and cutoff frequencies of high-pass and low-pass filters 12 and 13 are switched to settings suited to characteristics of the second sub-speaker 22.

In this case, since a sense of a sound direction becomes duller as a frequency becomes lower, even in monaural reproduction, a sound can be reproduced with little influences on stereo separation in listening.

In the above processing, an audio signal can be appropriately corrected by an output of the second sub-speaker 22 even when the television apparatus is used in the wall-mounted state. When the television apparatus is used with a certain space between a wall surface and the sub-speaker 2, even if a distance or acoustic reflection characteristics of the wall surface changes, a sound can be reproduced with little interferences or characteristic fluctuations caused by an influence of a reflected sound.

Figure 12:
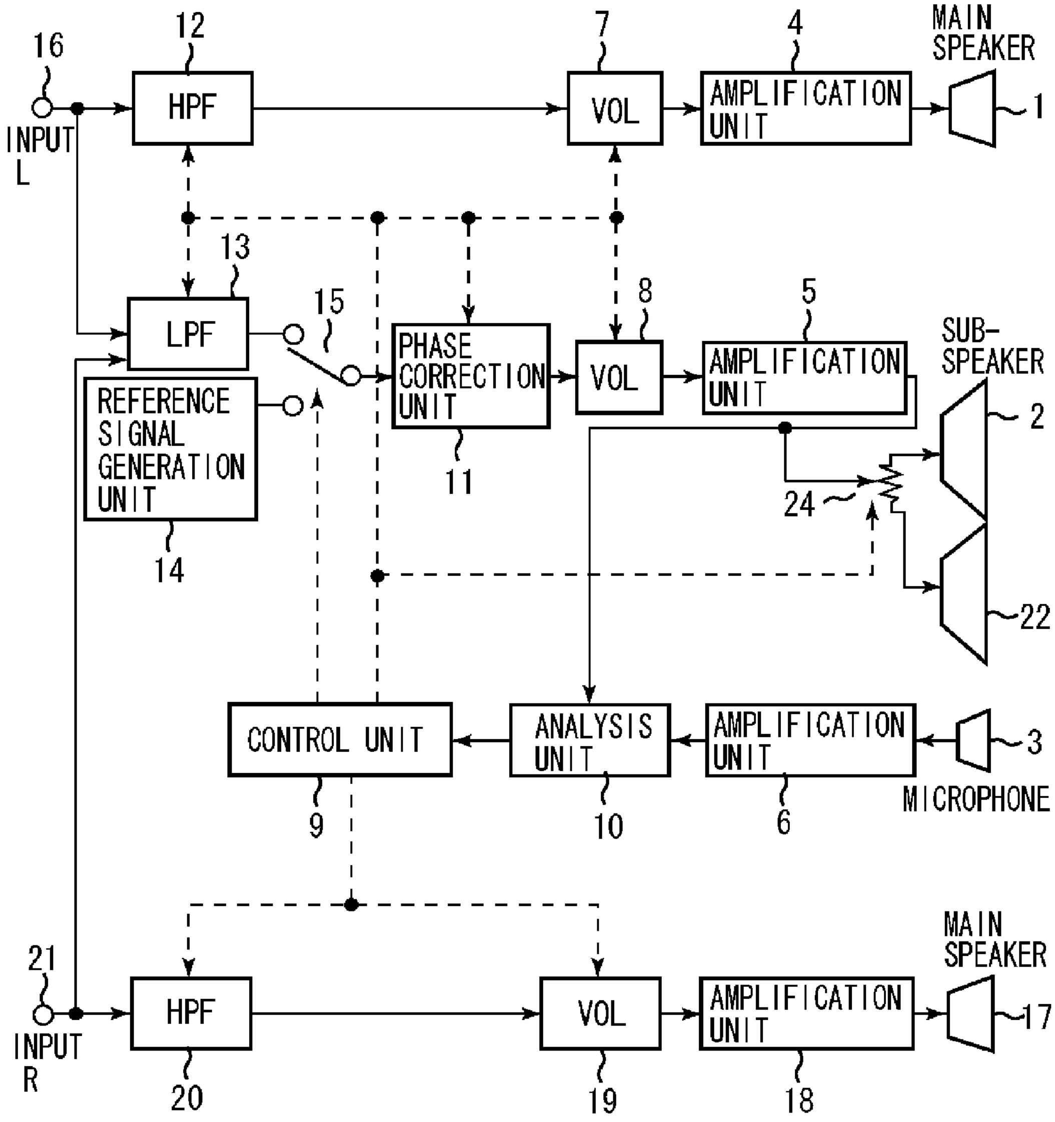
FIG. 12 is a block diagram illustrating an audio player apparatus according to a fifth embodiment of the present invention.

FIG. 12 is a block diagram of an audio player apparatus according to a fifth embodiment of the present invention.

Figure 13:
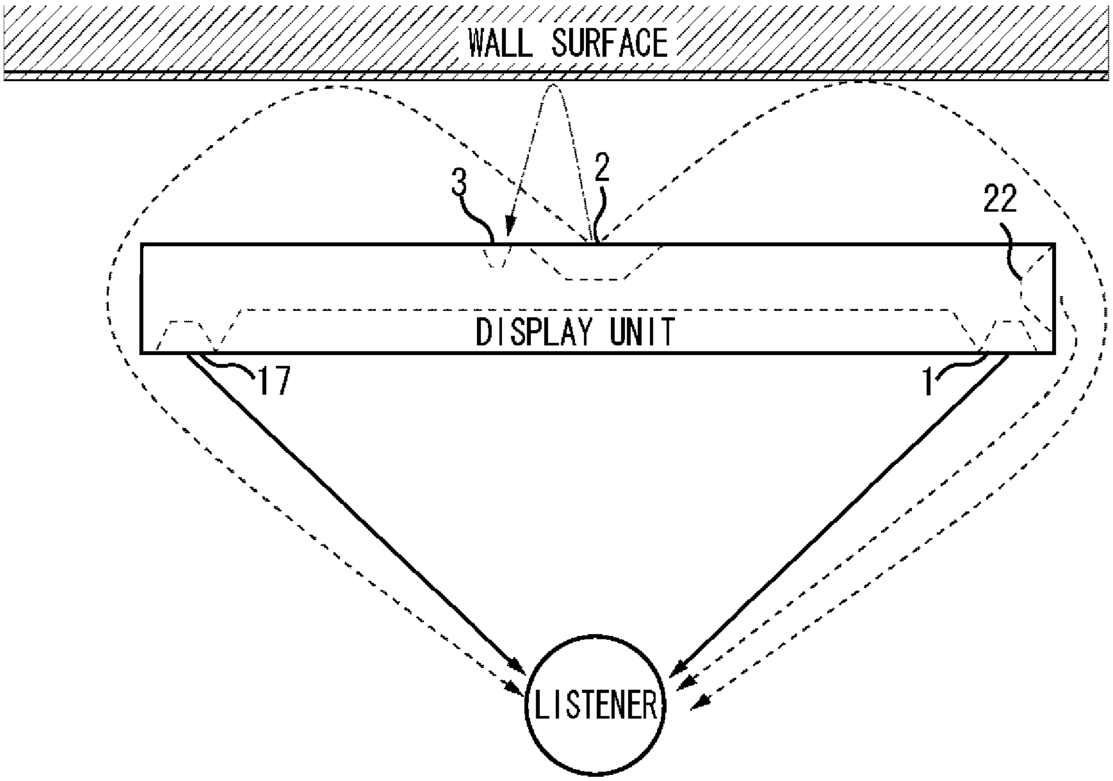
FIG. 13 is a schematic diagram illustrating a television apparatus which includes the audio player apparatus according to the fifth embodiment of the present invention.

FIG. 13 is a configuration diagram when the audio player apparatus of the fifth embodiment is applied to a television apparatus.

As in the case of the fourth embodiment, a second sub-speaker 22 is disposed in a position different from that of a first sub-speaker 2. The audio player apparatus of the exemplary embodiment includes, in place of the selection unit 23, a balance adjustment unit 24 configured to adjust an output balance of a second amplification unit 5.

As in the case of the fourth exemplary embodiment, correction processing is carried out according to the flowchart of FIG. 2.

A control unit 9 determines that reproduction using reflection on a wall surface is difficult or there is no wall surface when reflection time is longer as a result of reflection time analysis processing (step S2), or a reflection level is lower as a result of reflection frequency characteristic analysis processing (step S4). In this case, a reproduction level of the second sub-speaker 22 is increased. Since a sense of a sound direction becomes duller as a frequency becomes lower, even in monaural reproduction, a sound can be reproduced with little influences on stereo separation in listening.

Further, characteristics of a phase correction unit 11, a set volume of a second volume adjustment unit 8, and cutoff frequencies of high-pass and low-pass filters 12 and 13 may be adjusted according to the reproduction level of the second sub-speaker 22.

Thus, in the above processing, an audio signal can be corrected by an output of the second sub-speaker 22 even when the television apparatus is used in a state where reproduction using reflection on the wall surface by the sub-speaker 2 is difficult. When the television apparatus is used in a state where a wall surface having certain reflection characteristics is present behind the sub-speaker 2, even if a distance or acoustic reflection characteristics of the wall surface change, sound reproduction can be performed with little interferences or characteristic fluctuations caused by an influence of a reflected sound.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2008-023471 filed Feb. 4, 2008, which is hereby incorporated by reference herein in its entirety.

What is claimed is:

1. An apparatus comprising:

a first speaker arranged on a front-side of the apparatus;

a second speaker arranged on a backside of the apparatus;

a microphone, arranged on the backside of the apparatus, that receives a reflection sound which is output from the second speaker and reflected on an opposite wall of the backside of the apparatus;

an analysis unit that detects a reflection time indicating a time lag after the second speaker outputs the sound and before the microphone receives the reflection sound, based on the output sound and the received reflection sound; and a phase correction unit that corrects a phase of at least one of a sound output from the first speaker and a sound output from the second speaker, based on the reflection time.

2. The apparatus according to claim 1, wherein the phase correction unit corrects the phase so as to prevent interference between the sound output from the first speaker and the sound which is output from the second speaker and reflected on the wall.

3. The apparatus according to claim 1, further comprising:

a high-pass filter; and a low-pass filter, wherein the first speaker outputs a sound based on a first audio signal which is an input audio signal passed through the high-pass filter, and wherein the second speaker outputs a sound based on an audio signal which is the input audio signal passed through the low-pass filter.

4. The apparatus according to claim 3, further comprising:

a first adjustment unit that adjusts a signal level of the first audio signal; and a second adjustment unit that adjusts a signal level of the second audio signal, wherein the analysis unit detects frequency characteristics of the reflection sound, and wherein at least one of the first adjustment unit and second adjustment unit adjusts at least one of the signal level of the first audio signal and the signal level of the second audio signal, based on the frequency characteristics of the reflection sound.

5. The apparatus according to claim 3, wherein the analysis unit detects frequency characteristics of the reflection sound, the apparatus further comprising:

a control unit that controls at least one of the high-pass filter and low-pass filter to adjust at least one of a cutoff frequency of the high-pass filter and a cutoff frequency of the low-pass filter, based on frequency characteristics of the reflection sound.

6. The apparatus according to claim 1, further comprising:

a selector that selects the reference signal or input signal.

7. The apparatus according to claim 1, further comprising a generator that generates a reference signal.

8. A method for controlling an apparatus which includes a first speaker arranged on a front-side of the apparatus, a second speaker arranged on a backside of the apparatus, a microphone arranged on the backside of the apparatus, that receives a reflection sound which is output from the second speaker and reflected on an opposite wall of backside of the apparatus, an analysis unit and a phase correction unit;

the method comprising:

detecting, with the analysis unit, a reflection time indicating a time lag after the second speaker outputs the sound and before the microphone receives the reflection sound, based on the output sound and the received reflection sound; and correcting, with the phase correction unit, a phase of at least one of a sound output from the first speaker and a sound output from the second speaker, based on the reflection time.

9. The method according to claim 8, wherein correcting a phase of at least one of a sound output from the first speaker and a sound output from the second speaker, so as to prevent interference between the sound output from the first speaker and the sound which is output from the second speaker and reflected on the wall.

* * * * *